United States Patent [19]

Malchow

[11] 4,322,691

[45] Mar. 30, 1982

[54] CIRCUITRY FOR GENERATING ELECTRIC SIGNALS WITH PROPORTIONAL, OPPOSITE-SENSE RATES OF CHANGE

[75] Inventor: Max E. Malchow, Raritan Township, Somerset County, N.J.

[73] Assignee: RCA Corporation, New York, N.Y.

[21] Appl. No.: 143,346

[22] Filed: Apr. 24, 1980

[51] Int. Cl.³ .............................................. H03F 3/26
[52] U.S. Cl. .................................... 330/301; 330/288; 330/311
[58] Field of Search ...................... 330/288, 301, 311; 323/315

[56] References Cited

U.S. PATENT DOCUMENTS 3,531,730  9/1970  Steckler .
3,573,645  4/1971  Wheatley, Jr. .
4,001,706  1/1977  Prins et al. ........................ 330/301

Primary Examiner—James B. Mullins
Assistant Examiner—Gene Wan
Attorney, Agent, or Firm—E. M. Whitacre; P. J. Rasmussen; A. L. Limberg

[57] ABSTRACT

The circuitry comprises a source of input signal current, a common-base transistor amplifier or its equivalent supplying a first load means from its output connection, a first resistive means connected at its first end to the source of input signal current and at its second end to the input connection of the common-base transistor amplifier or its equivalent, a voltage follower with input connection from the first end of the first resistive means, a current mirror amplifier supplying a second load means from its output connection, and a second resistive means connected at its first end to the output connection of said voltage follower and connected at its second end to the input connection of the current mirror amplifier.

5 Claims, 1 Drawing Figure

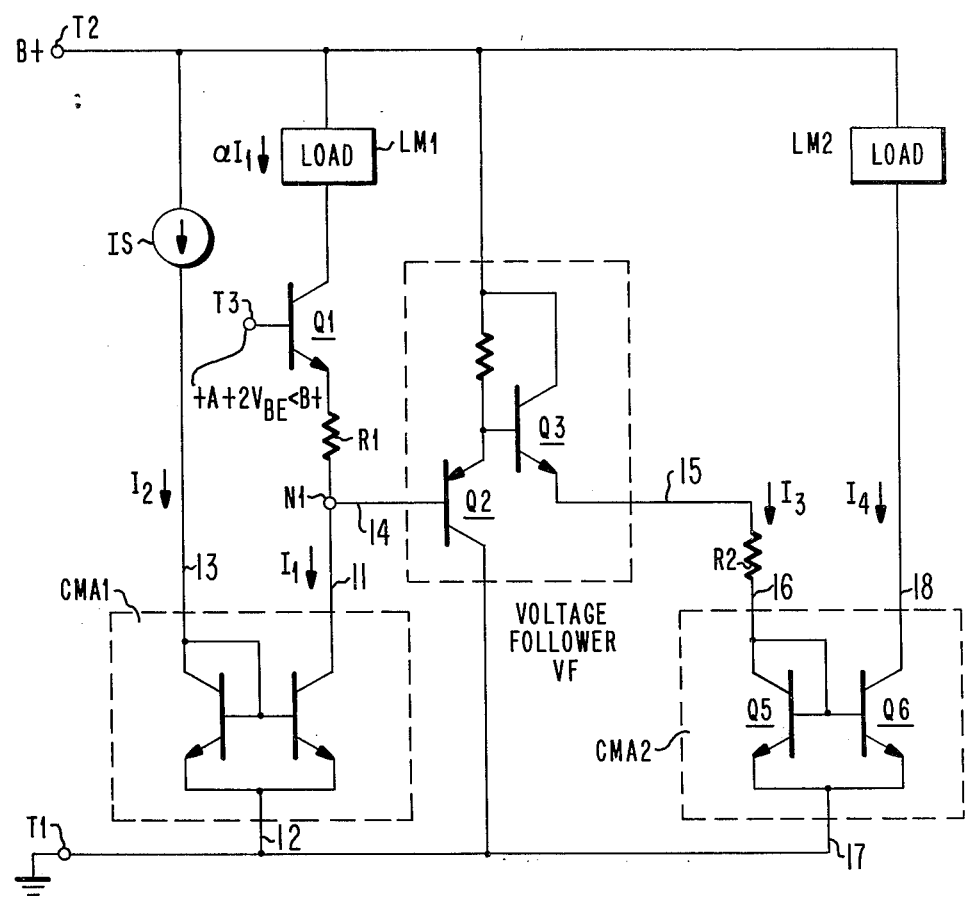

CIRCUITRY FOR GENERATING ELECTRIC SIGNALS WITH PROPORTIONAL, OPPOSITE-SENSE RATES OF CHANGE

The present invention relates to electronic circuitry for generating of electric signals which exhibit proportional, but opposite-sense rates of change.

Such generators are useful, for example, as phase splitter amplifiers. The circuitry of the present invention was originally developed, however, to develop automatic gain control (AGC) signals in a monolithic-integrated circuit designed to provide those portions of an FM radio receiver following the first detector, up to and including the second detector. AGC signals are applied to the radio frequency (r-f) amplifier preceding the first detector to avoid cross-modulation with adjacent channels during strong-signal reception. To broaden the market accessible to the integrated circuit it is desirable that it provide two AGC signals, one suitable for use with an r-f amplifier employing forward AGC and the other suitable for use with an r-f amplifier employing reverse AGC.

The present invention is embodied in electronic circuitry comprising a source of input signal current, a common-base transistor amplifier or its equivalent supplying a first load means from its output connection, a first resistive means connected at its first end to the source of input signal current and at its second end to the input connection of the common-base transistor amplifier or its equivalent, a voltage follower with input connection from the first end of the first resistive means, a current mirror amplifier supplying a second load means from its output connection, and a second resistor means connected at its first end to the output connection of said voltage follower and connected at its second end to the input connection of the current mirror amplifier.

The sole FIGURE of the drawing is a schematic diagram of circuitry embodying the present invention.

Terminals T1 and T2 are shown connected to receive a reference potential, ground, and to receive an operating potential, +B, respectively. Terminal T3 is connected to receive a bias potential intermediate between ground and B+—e.g., $+A+2V_{BE}$, as shown. Means are provided for withdrawing a unidirectional current $I_1$ with signal variations from node N1, which may as shown comprise a current mirror amplifier CMA1 with output connection 11 to node N1, with common connection 12 to terminal T1, and with input connection 13 to receive changing unidirectional current $I_2$ from a current source IS.

Essentially all of $I_1$ flows through resistive element R1 from the emitter of common-base-amplifier NPN transistor Q1, since the voltage follower VF is arranged to offer a relatively high impedance at its input connection 14. The resulting emitter current of Q1 flows in substantial portion $\alpha$ as its collector current supplied via its collector load means LM1, the remaining small portion flowing as base current from terminal T3. So the current $\alpha I_1$ in load means LM1 increases as the voltage at node N1 approaches reference potential at terminal T1 more closely and decreases as the voltage at node N1 becomes more remote from reference potential—i.e., as $I_1$ increases and decreases, respectively.

A non-inverting voltage amplifier, such as a voltage follower VF, responds to the voltage changes at its input connection 14 with voltage changes of the same sense at its output connection 15. These latter voltage changes are applied to a first end of a further resistive element R2, a second end of which connects to the input connection 16 of a current mirror amplifier CMA2. CMA2 is a current mirror amplifier of the type the input connection 16 of which is held at substantially fixed offset potential from its common connection 17, connected to receive reference potential from terminal T1. These connections cause the voltage drop across R2 to vary directly as the voltage between terminal T1 and node N1, responsive to which a current $I_4$ proportional to $I_3$ is demanded at the output connection 18 of CMA2. This demand is supplied from terminal T2 via load means LM2.

The current drawn through load means LM2 proportionately increases and decreases as $I_1$, decreases and increases, respectively; while the current $\alpha I_1$ drawn through load means LM1 proportionately decreases and increases, respectively. So these currents drawn through load means LM1 and LM2 exhibit rates of change that are proportional, but of opposite sense. It can be shown tht $\Delta I_4 / \Delta I_1 = -G R_1/R_2$ where $R_1$ and $R_2$ are the respective resistances of resistive elements R1 and R2, and where G is the absolute value of the current gain of CMA2 as between its input and output connections. Where the circuitry is to be used for phase-splitting, one can choose R1 equal to R2 and make G equal to unity, for example.

Voltage follower VF is advantageously made a zero-offset voltage follower by arranging common-collector-amplifier PNP transistor Q2 in cascade before common-collector-amplifier NPN transistor Q3. The $+2V_{BE}$ term of the voltage applied to terminal B then provides temperature compensation for the emitter-to-base offset voltages of common-base-amplifier transistor Q1 and of the master mirroring transistor Q5 of CMA2. CMA2 is shown as the simplest form of current mirror amplifier comprising only master and slave mirroring transistors Q5 and Q6, both of which are NPN conductivity type. The voltage at terminal T3 may be made eqaul to $+A$ plus some other multiple of $V_{BE}$ to accommodate other types of voltage follower VF—i.e., a simple emitter follower—or other types of CMA2—i.e., one when the collector-to-base feedback connection of Q5 has an emitter-follower inserted therein.

CMA1 may also take other forms and accommodations can be made to the use of emitter degeneration resistors in the master and slave mirroring transistors in either one or both of the current mirror amplifiers CMA1 and CMA2. While the embodiment of the invention shown employs bipolar transistors, field effect transistors may be used instead. The terms "base", "emitter" and "collector" in the claims should be construed to include "gate", "source" and "drain" within their respective ambits to afford claim coverage of such variations, since English lacks generic names for the corresponding electrodes of transistors of different types.

What is claimed is:

1. Apparatus for generating first and second signals that exhibit proportional but opposite-sense rates of change, comprising:
   first, second, and third supply terminals for receiving a reference voltage, an operating voltage, and a bias voltage intermediate to said reference and operating voltages;
   first and second resistive means having respective first and second ends;

means for applying a changing input current between said first terminal and the first end of said first resistive means;

a first transistor having an emitter electrode to which the second end of said first resistive means is connected, having a base electrode to which said third terminal is connected and having a collector electrode;

first load means connected to the collector of said first transistor for providing a direct-current-conductive path to said second terminal;

a non-inverting voltage amplifier having an input connection at the first end of said first resistive means and having an output connection at the first end of said second resistive means;

a current mirror amplifier having an input connection with the second end of said second resistive means, having a common connection to said first terminal, and having an output connection;

second load means connected to the output connection of said current mirror amplifier for providing a direct-current-conductive path to said second terminal.

2. Apparatus as set forth in claim 1 wherein said non-inverting voltage amplifier is a voltage-follower.

3. Apparatus as set forth in claim 2 wherein said voltage follower is of a type with substantially zero offset voltage between its input and output connections.

4. Apparatus as set forth in claim 3 wherein said voltage follower is a cascade connection of a pair of common-collector amplifier transistors of respective conductivity types which are complementary to and similar to that of said first transistor.

5. Apparatus as set forth in claim 1 wherein said means for applying a current between said first terminal and the first end of said first resistive means includes:

a further current mirror amplifier having an output connection to the first end of said first resistive means, having a common connection to said first terminal, and having an input connection for reception of changing unidirectional current.

* * * * *